United States Patent
Gospe et al.

[19]

[11] Patent Number: 6,029,730

[45] Date of Patent: Feb. 29, 2000

[54] HOT SHEAR APPARATUS AND METHOD FOR REMOVING A SEMICONDUCTOR CHIP FROM AN EXISTING PACKAGE

[75] Inventors: Stephen Bradford Gospe, Fremont; George Chiu, Palo Alto, both of Calif.

[73] Assignee: Intel Corporation, Santa Clara, Calif.

[21] Appl. No.: 09/001,021

[22] Filed: Dec. 30, 1997

[51] Int. Cl.[7] .................................................. B32B 35/00
[52] U.S. Cl. .......................... 156/584; 156/344; 29/426.5; 29/764; 219/535; 269/903
[58] Field of Search .................................... 156/344, 584, 156/94; 29/426.1, 426.3, 426.5, 762, 764; 219/535; 228/191; 269/903

[56] References Cited

U.S. PATENT DOCUMENTS

| | | | |
|---|---|---|---|
| 4,366,925 | 1/1983 | Fanene | 156/584 X |
| 4,909,428 | 3/1990 | Mermet-Guyennet | 228/191 X |
| 5,148,969 | 9/1992 | Boucher et al. | 156/584 X |
| 5,154,793 | 10/1992 | Wojnarowski et al. | 156/344 |
| 5,268,048 | 12/1993 | Leibovitz et al. | 156/94 |
| 5,423,931 | 6/1995 | Inoue et al. | 156/344 X |
| 5,425,833 | 6/1995 | Fujimoto et al. | 156/344 |
| 5,601,675 | 2/1997 | Hoffmeyer et al. | 156/94 |
| 5,715,592 | 2/1998 | Mori et al. | 228/191 X |

*Primary Examiner*—Mark A. Osele
*Attorney, Agent, or Firm*—Blakely, Sokoloff, Taylor & Zafman LLP

[57] ABSTRACT

The present invention provides a hot shear fixture for effectively and efficiently separating components of a device package for low yield analysis. More specifically, the hot shear fixture provides a cavity for receiving the desired device package and a shearing plate. Depending on the thermal properties of the package materials, the fixture, device package and shear plate are heated for a predetermined time before the shear plate is advanced to separate the desired components of the inserted device package.

19 Claims, 4 Drawing Sheets

HOT SHEAR APPARATUS AND METHOD FOR REMOVING A SEMICONDUCTOR CHIP FROM AN EXISTING PACKAGE

BACKGROUND OF THE INVENTION

1. Field of the Invention

This invention relates in general to removing a semiconductor chip from an existing package, and, more particularly, to a hot shear method and apparatus for removing a semiconductor chip from a defective controlled collapsed semiconductor chip connection (C4) package for low yield analysis.

2. Description of the Related Art

Before a new semiconductor device can be released into a market place, it is imperative that the product has undergone extensive testing. During such testing, it is not uncommon for the tested device to fail. Although, the manufacturer may have induced the failure to establish the active device parameters, more often than not, the reason for the failure is unknown. These types of failures can be related to the assembly process or to the device itself. Consequently, a low yield analysis of the failed device package must be conducted to help ascertain a solution.

FIGS. 1 and 2 illustrate a perspective and a cross-sectional view of a conventional device package 3, e.g., controlled collapsed semiconductor chip connection (C4), having a semiconductor chip 5 bonded and sealed to an organic substrate 7. Typically, the semiconductor chip 5 is bonded and sealed by an epoxy material 9 to the organic substrate 7, such as a BT laminate, a FR-4, or a cyanate ester substrate. The epoxy material 9 provides material properties to accommodate the dissimilar material properties between the silicon semiconductor chip 5 and the substrate 7. Additionally, the epoxy material 9 also acts as a filler between solder ball contacts 11 that allow I/O signals to move to/from the silicon semiconductor chip 5 and the organic substrate 7. The package 3 can be structurally defined by width $W_o$, height $H_o$, and length $L_o$ for the substrate 7, and by width $W_c$, height $H_c$, and length $L_c$ for the semiconductor chip 5 and the epoxy 9.

To conduct a low yield analysis of a failed C4 package 3, the silicon semiconductor chip 5 should be separated from the package 3 to accurately analyze and deduce the location and cause of the failure. For the low yield analysis to be effective, it is imperative for the separation process to limit any additional damage to the semiconductor chip 5 and/or the substrate 7 during the process.

A conventional technique used to remove a silicon semiconductor chip from a C4 package involves several steps. In general, the device is positioned into a jig or fixture, and the entire assembly is placed into an oven. Once the assembly has reached a desired temperature, it is removed from the oven and a shearing tool is used to remove the silicon semiconductor chip 5 from the organic substrate 7.

Although this technique may be effective in removing the silicon semiconductor chip 5 from the C4 package 3, it is not an effective and efficient method for the subsequent low yield analysis. This is true because of a lack of temperature stability, and thus repeatability, in the process. With this method, once the heated structure of the conventional method is removed for shearing, unavoidable temperature fluctuations make it difficult to separate the semiconductor chip 5 from the organic substrate 7 without further damaging either component of the package 3.

The present invention is directed to overcoming, or at least reducing the effects of, one or more of the problems set forth above.

SUMMARY OF THE INVENTION

In one aspect of the present invention, an apparatus is provided for removing a silicon semiconductor chip mounted on a substrate. The apparatus includes a shearing plate and a fixture having a cavity formed therein to receive the semiconductor chip, the substrate and the shearing plate. At least one heating element is located in thermal contact with the fixture.

In another aspect of the instant invention, a method is provided for separating components of a device package coupled by a binding material. The method includes inserting the package into a cavity of a fixture and positioning a portion of a shear plate within the fixture and aligned with a component of the package. The fixture is then heated and the shear plate is moved to separate the components of the package.

BRIEF DESCRIPTION OF THE DRAWINGS

Other aspects and advantages of the invention will become apparent upon reading the following detailed description and upon reference to the drawings. For the sake of clarity, the reference numbers used for similar elements of FIGS. 1 and 2 will be used to reference the same elements of the instant invention.

Figure 1:
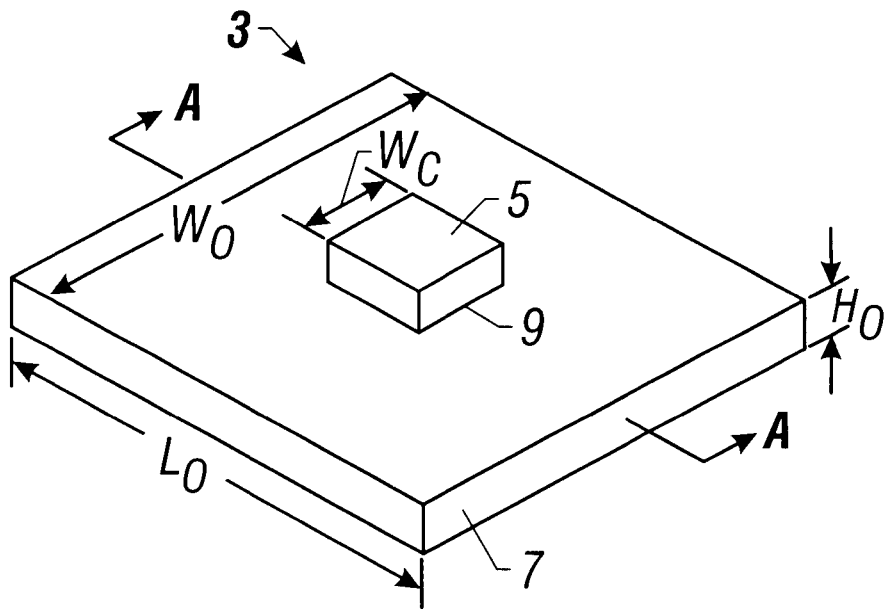
FIG. 1 is a perspective view illustrating a conventional device package.

While the invention is susceptible to various modifications and alternative forms, specific embodiments thereof have been shown by way of example in the drawings and are herein described in detail below. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and businessrelated constraints, which will vary from one implementation to another. Moreover, it will be appreciated that such a development effort might be complex and time-consuming, but would nevertheless be a routine undertaking for those of ordinary skill in the art having the benefit of this disclosure.

In general, the present invention provides a heated shearing fixture to effectively and efficiently separate a silicon semiconductor chip from a controlled collapsed semiconductor chip connection (C4) package. More specifically, the inventive fixture heats and maintains a C4 package at a temperature that will optimize the separation properties between the silicon semiconductor chip and organic substrate of the C4 package assembly, which will minimize any resultant damage associated with the C4 package separation. Additionally, because the temperature can be stabilized, the process is repeatable.

Figure 3:
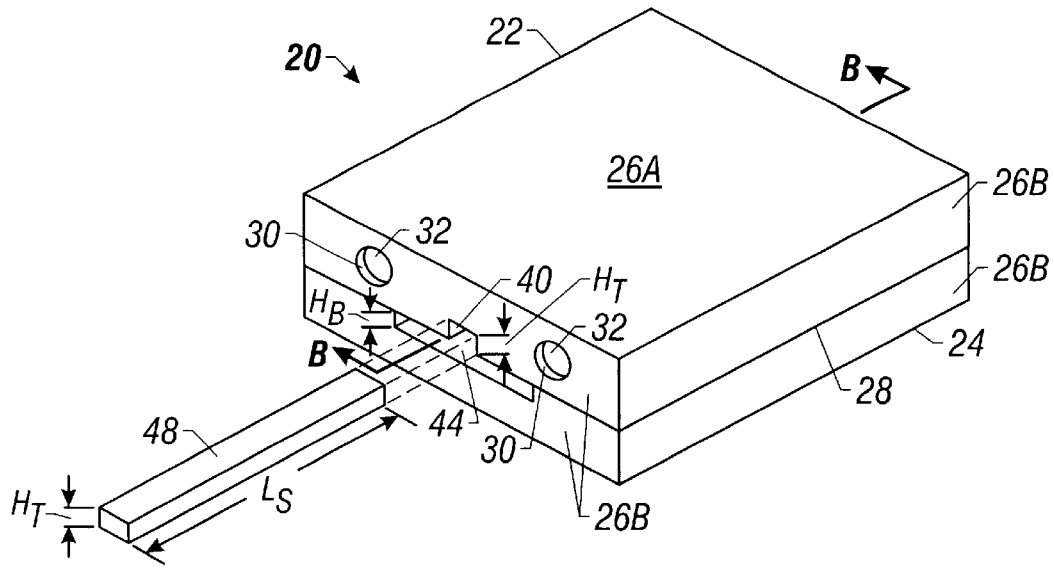
FIG. 3 illustrates a perspective view of a hot shear fixture in accordance with one embodiment of the present invention.
Figure 4:
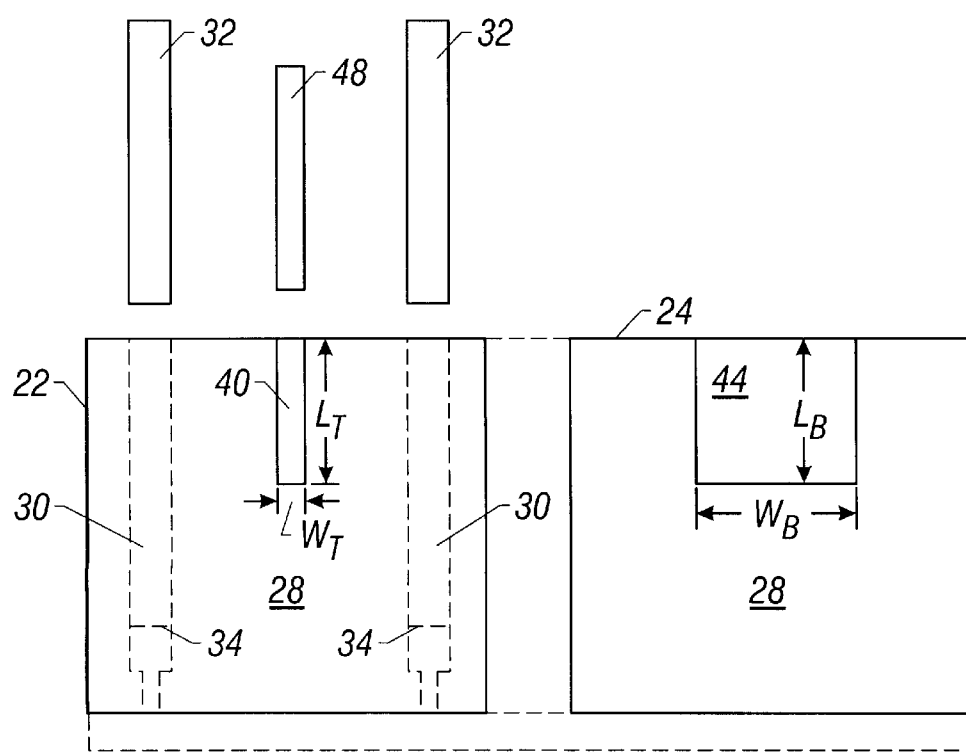
FIG. 4 illustrates the inside surface contours of the top and bottom plates for the hot shear fixture of FIG. 3.

Turning now to the drawings, FIGS. 3 and 4 illustrate a perspective and exploded view of a hot shear fixture 20 in accordance with one embodiment of the present invention. The fixture 20 includes a top plate 22 and a bottom plate 24 each having an exterior face surface 26A, a plurality of exterior end surfaces 26B, and an interior face surface 28. In one embodiment, the top and bottom plates 22 and 24 are made from an alloy material, such as 304 stainless steel. Two cylindrical holes 30 in the top plate 22 allow heating elements 32 to be in thermal contact with the fixture 20. The holes 30 extend from one of the end surfaces 26B of the fixture 20, along a plane parallel to the exterior face surface 26A, and to an area 34 laterally spaced from the opposite end surface 26B. In one embodiment, each heating element 32 is a 400 watt cylindrical heater coupled to a power source (not shown).

Figure 2:
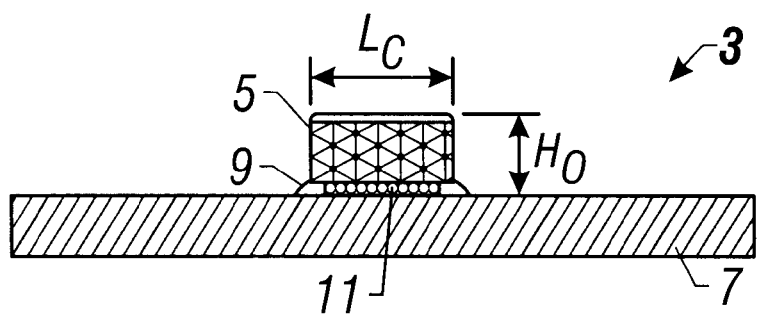
FIG. 2 is a cross-sectional view along axial A—A illustrating the conventional device package of FIG. 1.

In addition to the holes 30, a recess 40 is formed in the top plate 22 for receiving the semiconductor chip 5 and a shear plate 48. More specifically, the interior surface 28 of the top plate 22 provides a rectangular slot or recess 40 extending from the exterior end surface 26B to a central area of the top plate 22. With reference to FIGS. 1–4, the recess 40 can be defined by width $W_T$ and height $H_T$ being nearly equal to the width $W_c$ and height $H_c$, of the silicon semiconductor chip 5 and the epoxy 9. Similarly, the length $L_T$ of the recess 40 is nearly equal to length $L_o$ of the organic substrate 7. The interior surface 28 of the bottom plate 24 has a recess 44 formed therein. The recess 44 can be defined by a width $W_B$, length $L_B$, and height $H_B$. However, unlike the recess 40 where only two dimensions where similar to the dimension of package 3, the recess 44 provides a width $W_B$, height $H_B$, and length $L_B$ which is nearly equal to the width $W_o$, height $H_o$, and length $L_o$ of the organic substrate 7 as illustrated in FIGS. 1 and 2. As will be appreciated by skilled artisans, the dimensions of the recesses 40, 44 will vary depending on the size of package 3 used in conjunction with the present invention.

After the desired C4 package 3 is inserted into the cavity formed by the recesses 40 and 44, the shearing plate 48 is positioned in the recess 40. The length $L_S$ of the shearing plate 48 is greater than the length $L_T$ of the recess 40, and can be connected to a machine for applying a shear force. The shearing plate 48 is made of a conductive material such as an alloy or ceramic that is resilient to temperatures over 400° F.

As depicted in FIG. 3, the top and bottom plates 22 and 24 are secured together for operational purposes. In one embodiment, screws or clamps (neither shown) would be used in a conventional manner. For example, a hinge (not shown) could be used to couple the plates 22 and 24 at one end surface 26B and a clamp, screw, bolt, or clasp at the opposite end surface 26B. In another embodiment, a thermally resistive adhesive compound or a conventional welding technique can be applied to secure the two plates together.

Figure 5A:
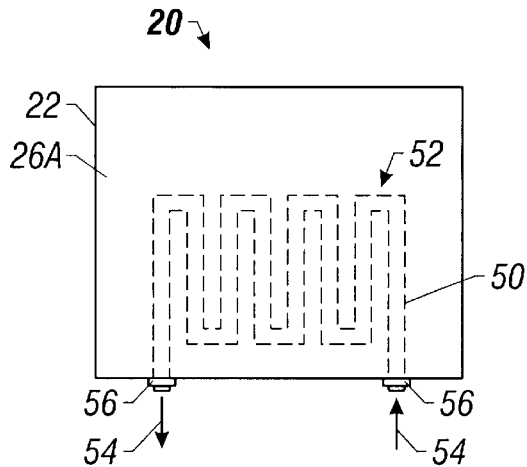
FIGS. 5A and 5B illustrate alternative embodiments for the heating element of the present invention illustrated in FIG. 3.
Figure 5B:
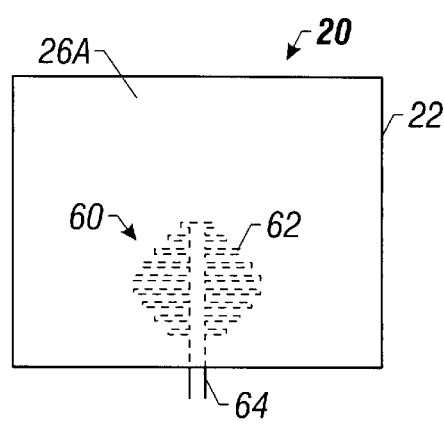

FIGS. 5A and 5B illustrate alternative heating structures that may be substituted for the heating element 32 of the fixture 20. More specifically, as illustrated in FIG. 5A, the holes 30 for the heating element 32 of FIG. 3 could be replaced with a fluid circulation tunnel 50 implemented through the top plate 22 in a radiator-type configuration to surround or cover the recess 40. This liquid heater system 52 would use an external heater and pump (neither shown) to heat and circulate fluid 54 through the plate 22. Natural conductive material properties of the plates 22 and 24 will thermally heat the fixture 20 and the package 3 to the desired temperature when heated fluid 54 circulates. Input and output valves 56 for the fluid circulation tunnel 50 may be attached to exterior surfaces 26A or 26B, and coupled by hoses (not shown) to the necessary fluid heater and pump.

Any of a variety of types of thermally conductive fluid 54 can be used in the liquid heater system 52, but some may perform better than others, depending on the temperature needed during the thermal cycling process. For example, in one embodiment the fluid 54 for low temperature applications of less than 338° F. may include water and ethylene glycol. On the other hand, for high temperature applications of greater than 338° F., propylene glycol could be used as the fluid 54. As an alternative to the fluid 54, pressurized steam, dry air or gas could also be circulated through tunnel 50 to heat the fixture 20.

In another alternative embodiment of the heating element 32, FIG. 5B illustrates a foil heater 62 that could be attached to or imbedded within the top plate 22 of the fixture 20. In one embodiment, the foil heater 62 would include at least one line 64 positioned between an upper and lower insulation layer formed from a material, such as KAPTON®. The line 64 would be made of an electrically conductive material, such as tungsten or nickel-chromium, and the ends of the line 64 would be connected to a power supply through a power modulator (neither shown). Using conventional techniques, the line 64 could be patterned to vary the watt density in specific regions of the foil heater 62 to provide intentional temperature non-uniformities. For example, the temperature surrounding the center of the fixture 20 could have a higher temperature than the end surface 26B. If desired, multiple lines 64 could also be used to form specific zones in the top plate 22.

It will be appreciated by persons of ordinary skill in the relevant arts that the foil heater 62 could be replaced with various heating elements such as an array of thermoelectric devices, a cable heater, a cartridge heater, a cast-in heater, or the like. Each replacement would provide functionally similar heating properties and capabilities as the foil heater 62.

Figure 6:
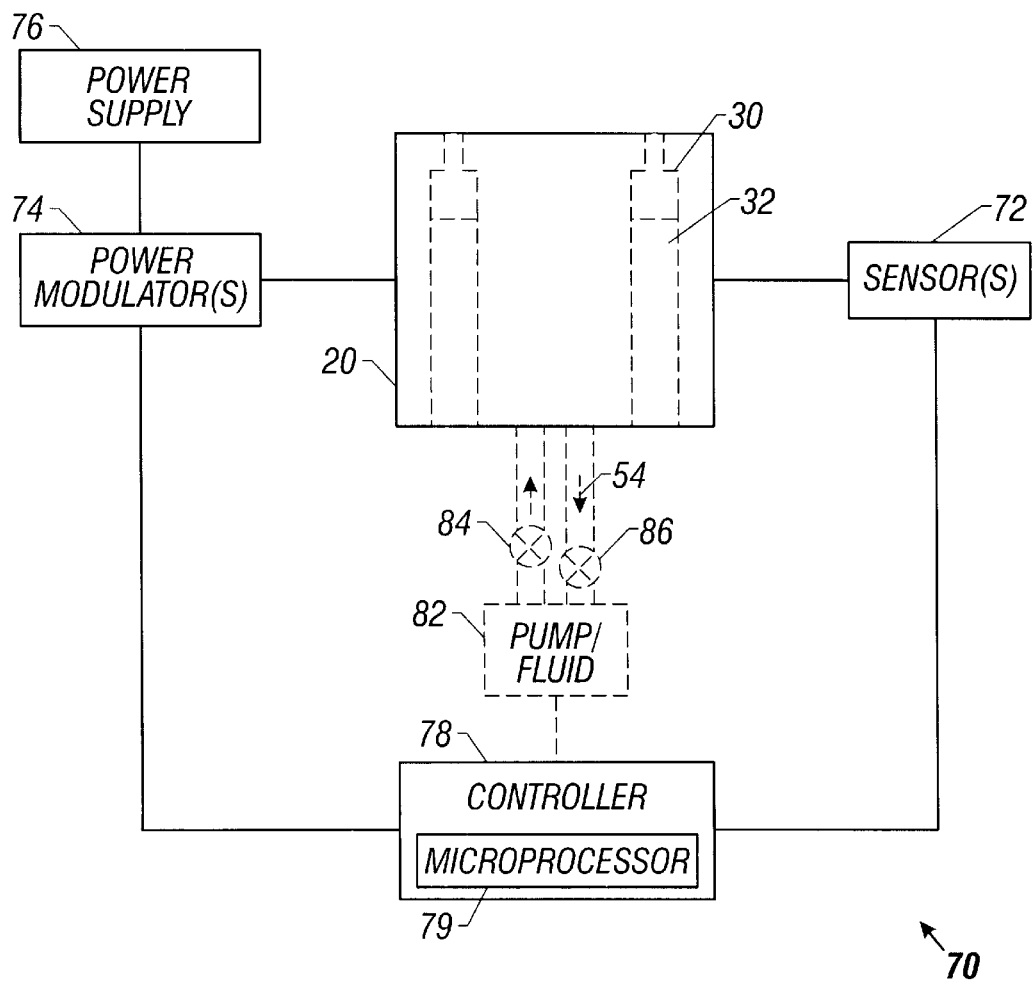
FIG. 6 is a schematic diagram of a feedback control loop according to one embodiment of the present invention.

In one embodiment, the heating element 32, 52, or 62 of the fixture 20 is controlled by a feedback control loop. The feedback control loop is used to regulate the temperature of the fixture 20 during the thermal shearing process of the fixture 20. As illustrated in FIG. 6, a control loop 70 includes a sensor(s) 72 and a modulator(s) 74 electrically connected through a controller 78. The sensor(s) 72 sends electrical signals representative of a temperature or process parameter to the controller 78. Process parameters could include the temperature of the individual heating element 32, 52, or 62, or the flow pressure of the fluid 54 if the heating element 52 is used. Each parameter can be monitored as frequently or as infrequently as necessary for a given thermal cycling process.

Based on the sensor signals received by the controller 78, a microprocessor 79 calculates control signals independently based upon desired process parameters for the thermal shearing process. The control signals are sent to each respective power modulator 74. In response, the power modulator(s) 74 controls the flow of electric current to each heating element 32, 52, or 62. This allows the fixture 20 to be heated, maintained, or cooled for any thermal cycle. If the fluid tunnel 50 is implemented to the heat fixture 20, then the microprocessor 79 could also calculate additional temperature control signals for a fluid supply 82, and to an outflow valve 84 and inflow valve 86 for increasing, stopping, or decreasing the circulation of the fluid 54 in the fluid tunnel 50. The fluid supply 82 includes conventional means for supplying, heating and pumping the necessary fluid 54.

Each sensor 72 may be either a temperature or process sensor, such as a thermocouple sensor, an infrared (IR) sensor, or a scattermoter. Techniques for mounting and positioning such sensors are well known in the art. The modulator(s) 74 is a device such as a solid-state relay circuit or a linear power amplifier. The power supply 76 and modulator(s) 74 provide a variable supply of power. Although the power supply 76 preferably provides 120 V AC, any suitable voltage and/or direct current may also be used to power the heating element 32, 52, or 62.

Figure 7:
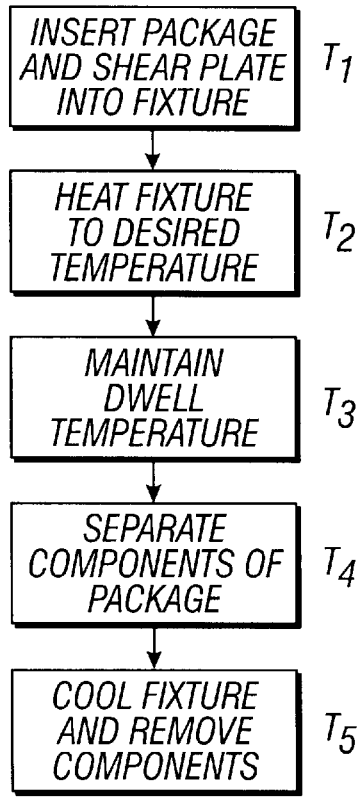
FIG. 7 provides a flow chart illustrating the operational parameters for the thermal cycling process of the present invention.
Figure 8A:
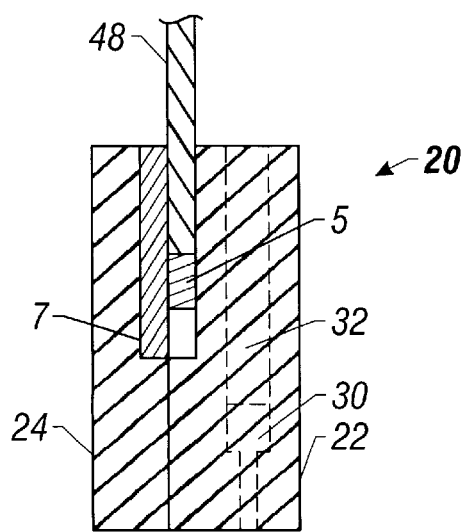
FIGS. 8A and 8B illustrate a cross-sectional view of the hot shear fixture during a first and second process step of the present invention, taken along axial B—B of FIG. 3.
Figure 8B:
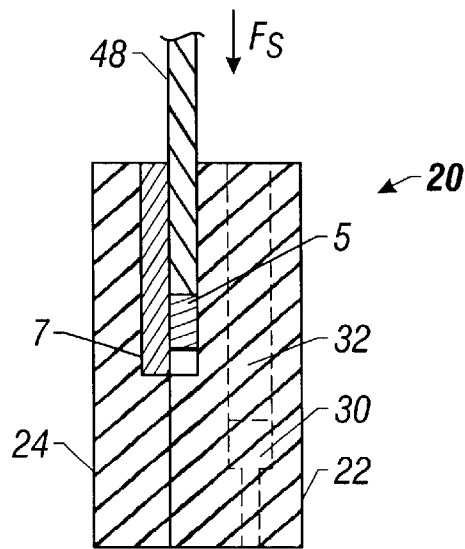

With the inventive apparatus and control system now described, a general process for hot shearing a semiconductor chip of a C4 package using the present inventive fixture 20 will follow with reference to FIGS. 7, 8A and 8B. Generally, FIG. 7 shows a flow chart of one embodiment of the process, and FIGS. 8A and 8B illustrate a cross-sectional view of FIG. 3 taken along the line B—B, before and after the semiconductor chip 5 is removed from the substrate 7 within the heated fixture 20, respectively.

More specifically, with reference to FIG. 7, a user will chose a controlled collapsed semiconductor chip connection (C4) package 3, typically one that is defective, and insert the package 3 into the fixture 20 during time $T_1$. This insertion process step involves aligning the package 3 so that the semiconductor chip 5 and the substrate 7 will be received by the top plate recess 40 and the bottom plate recess 44, respectively. Depending on the design of the fixture 20, the substrate 7 of the package 3, when positioned in the fixture 20, may or may not be completely encapsulated by the fixture 20. In other words, although the semiconductor chip 5 will be completely encapsulated and laterally spaced from the outside end surface 26B by the fixture 20 to provide a thermally contained structure, an end portion of the substrate 7 will either be flush with or extend just past the outside end surface 26B. By allowing a portion of the substrate 7 to extend past the outside surface 26B, the user is provided with a region to grab package 3 for insertion and removal.

Also during time $T_1$, the shear plate 48 is positioned into the top plate recess 40 of the fixture 20, as illustrated in FIG. 8A. With the substrate 7 positioned in the recess 44, the shear plate 48 fits snugly in the recess 40 and can be advanced until it rests against the semiconductor chip 5 of the package 3. Since the shear plate 48 is made of a thermally conductive material, the semiconductor chip 5 is now thermally contained. In other words, the active heating element 32, 52, or 62 can effectively and efficiently transfer heat uniformly to the semiconductor chip 5.

At the start of time period $T_2$, the controller 78 sends a control signal to the power modulator(s) 74 coupled to the heating element 32, 52, or 62. This control signal allows sufficient current to flow through the heating element 32, 52, or 62 to elevate the temperature of the fixture 20 and the package 3 from a room temperature of about 70° F. to 350° F. If the thermal fluid tunnel 50 of FIG. 5A is used, the controller 78 may also send control signals to the power modulator(s) 74 to regulate the valves 84 and 86 to control the flow of fluid 54 through the thermal fluid tunnel 50.

By the end of time period $T_2$, the sensor(s) 72 indicates a temperature of 350° F., and the controller 78 begins a dwell time period $T_3$. For the next 20 minutes of time period $T_3$, a uniform temperature of 350° F. is maintained through the feedback loop 70 of FIG. 6. More specifically, if the sensor (s) 72 indicates a temperature other than 350° F. for the fixture 20, then the controller 78 calculates and sends a new control signal to the power modulator(s) 74 to change the flow of electric current through the heating element 32, 52, or 62. In this manner of feedback, the temperature of the heating element 32, 52, or 62, the fixture 20, and the package 3, is dynamically maintained at a uniform temperature of 350° F. This temperature, which is set between the transition temperature of the epoxy 9 and the decomposition temperature of the substrate 7, will effectively alter the securing structure of the epoxy 9 and the solder bumps 11 to provide an optimum viscous structure for package separation. Consequently, this dwell temperature may vary substantially (e.g., plus or minus 100° F.), depending on the materials used for the given Referring to FIG. 8B, a lateral force $F_s$ of about 100 lbs is applied to the distal end of shear plate 48 by a device, such as a conventional tabletop Instron MTS machine during time period $T_4$. In one embodiment, the force $F_s$ will be provided at a constant rate and speed of about 2 inches per minute, however, this value, as well as the force $F_s$, will vary relative to the material properties of the package being sheared.

With the semiconductor chip 5 removed from the substrate 7, the heating element 32, 52, or 62 is deactivated and the fixture 20 cools for a time $T_5$. If the heating element 52 is utilized, the controller 78 could initialize a cold fluid 54 to flow through the thermal fluid tunnel 50 to accelerate or control the cooling process. Once the sensor(s) 72 indicates that the fixture 20 has cooled to a safe temperature for removal, the semiconductor chip 5 and the substrate 7 will be removed from the fixture 20. If necessary, this may include the steps of unscrewing or unclamping any securing mechanisms holding the top and bottom plates 22 and 24 together.

It will be appreciated by persons of ordinary skill in the relevant arts that the controller 78 can be programmed to execute this and many other thermal cycles involving any number of phases and transitions of different types. In addition, the fixture of the present invention may be used for purposes other than semiconductor chip removal for a C4 package. For example, the module may be used to remove semiconductor chips from other similar device packages such as a standard DIP (Dual In-line Package), VSMP (Vertical Surface Mount Package), LCC (leadless semiconductor chip carrier), or QFP (quad-flat package).

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. An apparatus for removing a silicon semiconductor chip mounted on a substrate, comprising:
   a shearing plate;
   a fixture having a cavity formed therein, said cavity approximately sized to receive said semiconductor chip, said substrate, and said shearing plate with a minimum amount of empty space; and,
   at least one heating element in thermal contact with said fixture.

2. The apparatus of claim 1, further including:
   a process sensor in thermal contact with said fixture; and
   a control unit coupled to said at least one heating element and said process sensor to selectively enable said heating element and control the temperature of said fixture.

3. The apparatus of claim 2, wherein said control unit is further adapted to receive a signal from said process sensor, compare said received signal to a predetermined value, and send a control signal to said heating element responsive to a difference in said received signal and said predetermined value.

4. The apparatus of claim 2, wherein said process sensor is a thermocouple.

5. The apparatus of claim 1, including at least one cavity extending into said fixture and wherein said at least one heating element further includes a cylindrical heater positioned within said cavity.

6. The apparatus of claim 1, wherein said fixture further includes:
   top and bottom portions;
   said top portion having a first surface forming a first recess therein and opening onto a second surface;
   said bottom portion having a third surface and forming a second recess therein and opening onto a fourth surface;
   at least one securing element for coupling said top and bottom portions together arranged with said first and third surfaces immediately adjacent and said second and fourth surfaces adjacent; and
   said shear plate being adapted to be inserted into the recesses opening onto the second and fourth surfaces.

7. The apparatus of claim 6, wherein said at least one securing element further includes at least one of a clamp, an adhesive glue, and a hinge.

8. The apparatus of claim 1, wherein said heating element further includes a foil heater coupled to said fixture.

9. The apparatus of claim 1, wherein said heating element further includes a fluid heating circulation tunnel formed within said fixture.

10. The assembly of claim 1, wherein said shear plate is made from an alloy.

11. The assembly of claim 1, wherein said shear plate is made from a material including at least one of aluminum, copper, and ceramic.

12. The assembly of claim 1, further including means for applying pressure to said shear plate to separate the semiconductor chip from the substrate while being contained by said fixture.

13. The apparatus of claim 1, wherein said semiconductor chip and said substrate are parts of a C4 package.

14. A process for separating from a substrate a semiconductor chip directly coupled by a binding material to the substrate, comprising:
   inserting the semiconductor chip and substrate into a cavity of a fixture, said chip and substrate held in place by said fixture;
   positioning a portion of a shear plate within said fixture aligned with the chip;
   heating the fixture; and,
   moving said shear plate to separate said semiconductor chip from said substrate.

15. The process of claim 14, further including:
   receiving a signal from a temperature sensor coupled to said fixture;
   comparing said received signal to a predetermined value; and
   controlling at least one heating element coupled to said fixture responsive to a difference in said received signal and said predetermined value.

16. The process of claim 14, wherein comparing includes comparing said received signal to a predetermined value corresponding to a temperature between the transition temperature of the binding material and a decomposition temperature of the package.

17. The process of claim 16, wherein said predetermined value corresponds to a temperature between about 250° F. and 450° F.

18. The process of claim 14, wherein said heating further includes:
   positioning at least one heating element in thermal contact with said fixture;
   activating said at least one heating element for a predetermined time; and
   deactivating said at least one heating element.

19. The process of claim 14, wherein said semiconductor chip and said substrate are parts of a C4 package.

* * * * *

UNITED STATES PATENT AND TRADEMARK OFFICE
CERTIFICATE OF CORRECTION

PATENT NO. : 6,029,730
DATED : February 29, 2000
INVENTOR(S) : Gospe et al.

It is certified that error appears in the above-identified patent and that said Letters Patent is hereby corrected as shown below:

In column 6, at line 26, after "given" insert --package 3.--.

Signed and Sealed this

Eighth Day of May, 2001

*Attest:*

NICHOLAS P. GODICI

*Attesting Officer*    *Acting Director of the United States Patent and Trademark Office*